Figure 1:
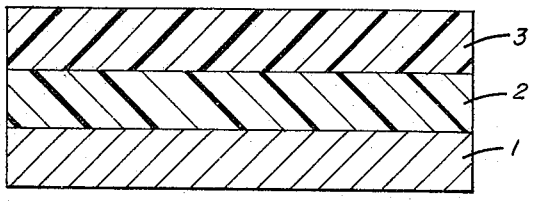
Figure 2:
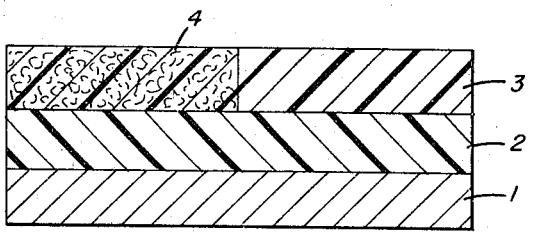
Figure 3:
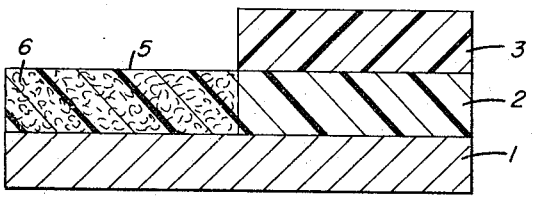
Figure 4:
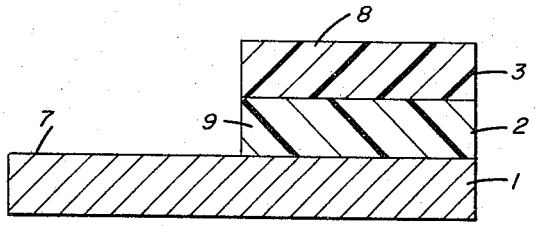
Figure 5:
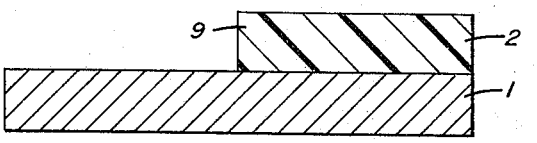

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JANUARY 6, 1970

870 O.G. 18

T870,005

PRINTING PLATE PROCESSED BY AN ETCH-BLEACH TECHNIQUE

Robert N. Woodward and Daniel E. Haseley, both of Kodak Park, Rochester, N.Y. 14650

Filed Aug. 13, 1969, Ser. No. 849,648

Int. Cl. G03f *7/02;* R41n *3/00;* C03c *5/00*

U.S. Cl. 96—33

1 Sheet Drawing. 19 Pages Specification

A photographic element useful to make a lithographic printing plate comprises a support, an oleophilic layer of an organic solvent soluble synthetic resin, and a hardened gelatino silver halide emulsion layer. A printing plate is provided by first developing the exposed element to provide a silver image, which may be either a negative or a direct positive image, in the emulsion layer. The developed portion of the emulsion is then removed by an etch-bleach step and the underlying resin thus exposed is removed by contact with an organic solvent. The remaining portions of the light-sensitive layer are then removed to provide a printing plate having raised oleophilic ink-receptive portions of synthetic resin which correspond to the undeveloped portions of the emulsion.

Jan. 6, 1970 R. N. WOODWARD ETAL T870,005

PRINTING PLATE PROCESSED BY AN ETCH-BLEACH TECHNIQUE

Filed Aug. 13, 1969

ROBERT N. WOODWARD
DANIEL E. HASELEY
INVENTORS

BY Henry E. Byers

ATTORNEY